United States Patent
Yao et al.

(10) Patent No.: US 9,721,880 B2
(45) Date of Patent: Aug. 1, 2017

(54) INTEGRATED CIRCUIT PACKAGE STRUCTURES

(71) Applicant: Intel Corporation, Santa Clara, CA (US)

(72) Inventors: Jimin Yao, Chandler, AZ (US); Sanka Ganesan, Chandler, AZ (US); Shawna M. Liff, Scottsdale, AZ (US); Yikang Deng, Chandler, AZ (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/969,940

(22) Filed: Dec. 15, 2015

(65) Prior Publication Data

US 2017/0170105 A1    Jun. 15, 2017

(51) Int. Cl.

| | | |
|---|---|---|
| H01L 23/12 | (2006.01) | |
| H01L 21/00 | (2006.01) | |
| H05K 7/10 | (2006.01) | |
| H01L 23/498 | (2006.01) | |
| H01L 23/31 | (2006.01) | |
| H01L 21/48 | (2006.01) | |
| H05K 1/18 | (2006.01) | |
| H05K 1/03 | (2006.01) | |
| H05K 3/34 | (2006.01) | |

(Continued)

(52) U.S. Cl.
CPC .... H01L 23/49816 (2013.01); H01L 21/4853 (2013.01); H01L 23/3114 (2013.01); H01L 23/49838 (2013.01); H01L 24/81 (2013.01); H05K 1/03 (2013.01); H05K 1/18 (2013.01); H05K 3/34 (2013.01); H01L 24/14 (2013.01); H01L 25/0657 (2013.01)

(58) Field of Classification Search
CPC ............... H01L 23/3128; H01L 24/81; H01L 23/49816; H01L 23/49838; H01L 21/4853; H01L 24/14; H01L 23/3114; H01L 25/0657; H05K 1/03; H05K 1/18; H05K 3/34
See application file for complete search history.

(56) References Cited

U.S. PATENT DOCUMENTS 5,285,352 A * 2/1994 Pastore ................. H01L 23/36 165/185
6,400,019 B1 * 6/2002 Hirashima ........ H01L 23/49816 257/737

(Continued)

OTHER PUBLICATIONS

International Search Report and Written Opinion issued on Feb. 27, 2017 in PCT Application No. PCT/US2016/061763; 11 pages.

*Primary Examiner* — Alonzo Chambliss
(74) *Attorney, Agent, or Firm* — Patent Capital Group

(57) ABSTRACT

Integrated circuit (IC) package structures, and related devices and methods, are disclosed herein. In some embodiments, an IC package substrate may include: a dielectric layer having a first face and a second face; a metal layer disposed at the first face of the dielectric layer and having a first face and a second face, wherein the second face of the metal layer is disposed between the first face of the metal layer and the second face of the dielectric layer; a package contact at the first face of the metal layer to couple the IC package substrate to a component; and a die contact at the first face of the metal layer to couple a die to the IC package substrate.

22 Claims, 10 Drawing Sheets

(51) Int. Cl.
*H01L 23/00* (2006.01)
*H01L 25/065* (2006.01)

(56) References Cited

U.S. PATENT DOCUMENTS

| | | | | |
|---|---|---|---|---|
| 6,844,619 B2* | 1/2005 | Tago | .......... | H01L 23/3114 257/686 |
| 6,906,408 B2* | 6/2005 | Cloud | .......... | H01L 25/0652 257/686 |
| 7,368,821 B2* | 5/2008 | Kim | .......... | H01L 23/3128 257/693 |
| 8,987,132 B2* | 3/2015 | Gruber | .......... | B23K 3/0638 438/614 |
| 2003/0146510 A1* | 8/2003 | Chien | .......... | H01L 23/49827 257/738 |
| 2004/0262735 A1* | 12/2004 | Higashi | .......... | H01L 23/5389 257/686 |
| 2006/0151203 A1* | 7/2006 | Krueger | .......... | H03H 9/0557 174/260 |
| 2007/0108589 A1* | 5/2007 | Jin | .......... | H01L 23/3128 257/700 |
| 2008/0251906 A1* | 10/2008 | Eaton | .......... | H01L 25/0655 257/686 |
| 2009/0140426 A1* | 6/2009 | Lee | .......... | H01L 24/16 257/741 |
| 2010/0295174 A1* | 11/2010 | Ozawa | .......... | H01L 23/49838 257/737 |
| 2011/0221074 A1* | 9/2011 | Kang | .......... | H01L 21/568 257/778 |
| 2012/0104607 A1 | 5/2012 | Weng | | |
| 2012/0126416 A1 | 5/2012 | Lee et al. | | |
| 2012/0313239 A1 | 12/2012 | Zohni | | |
| 2013/0175705 A1 | 7/2013 | Lin et al. | | |
| 2013/0277841 A1 | 10/2013 | Lii et al. | | |

\* cited by examiner

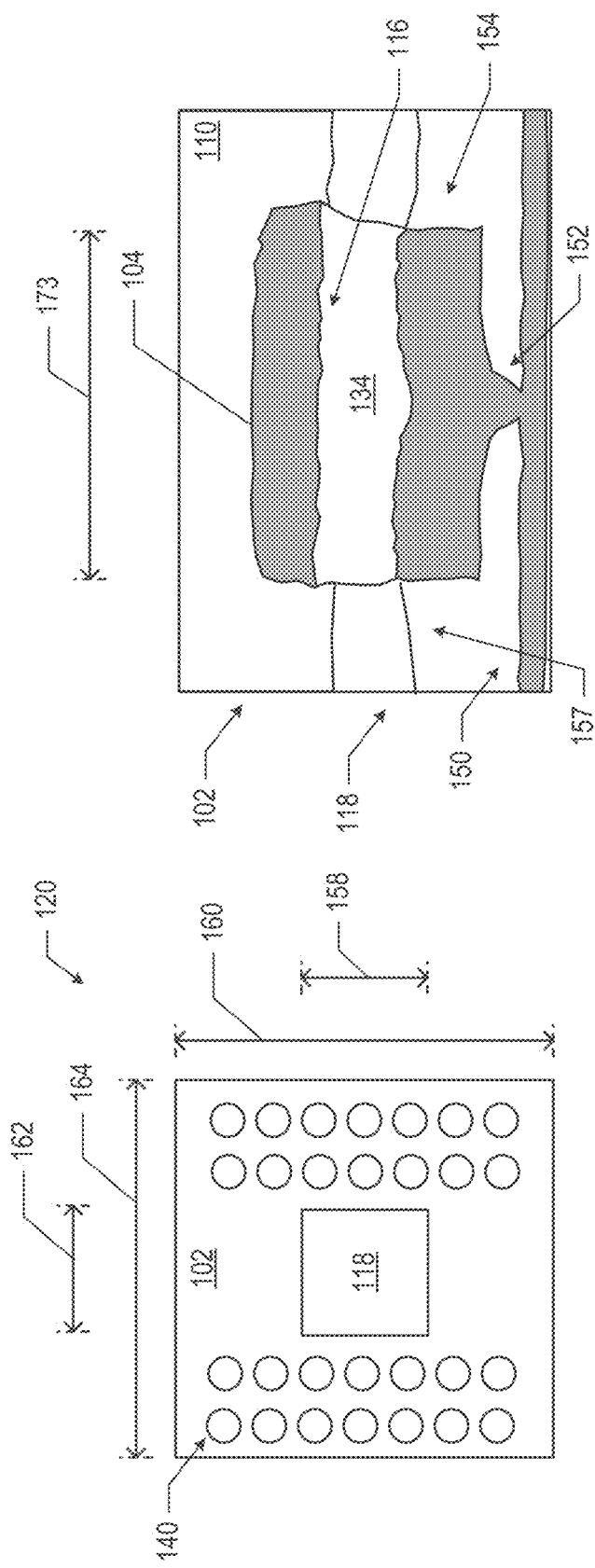

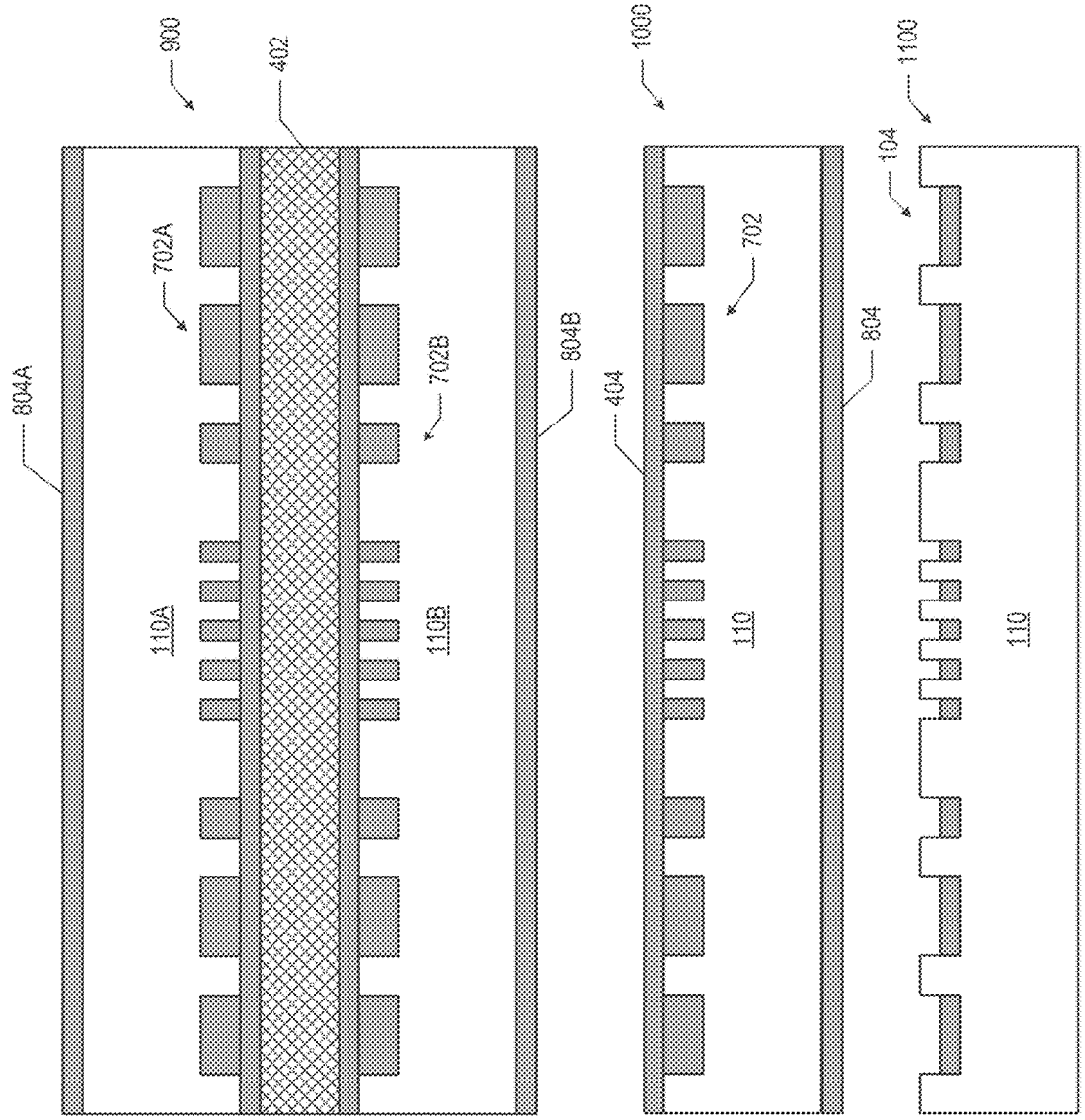

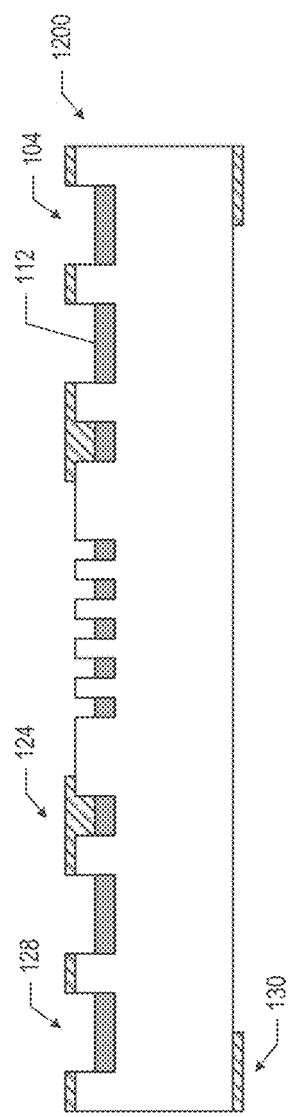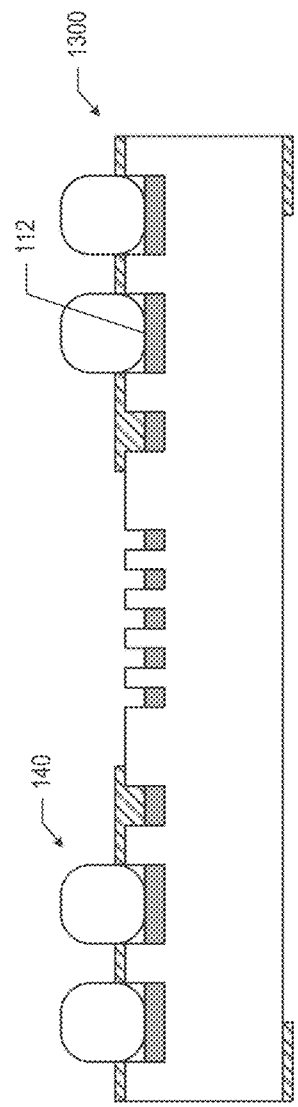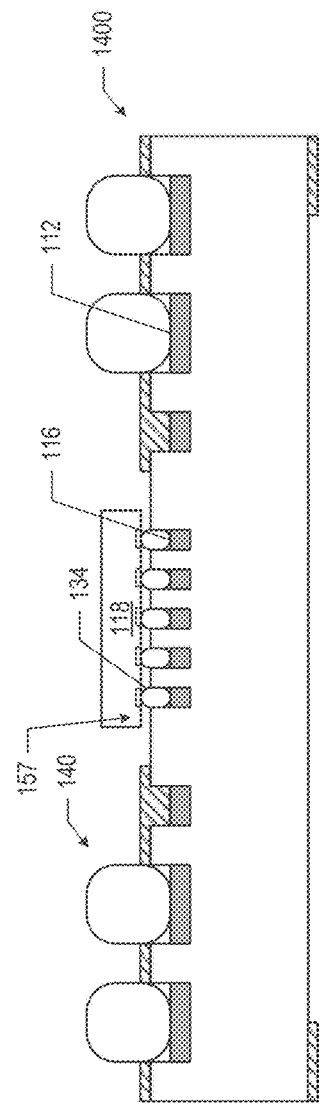

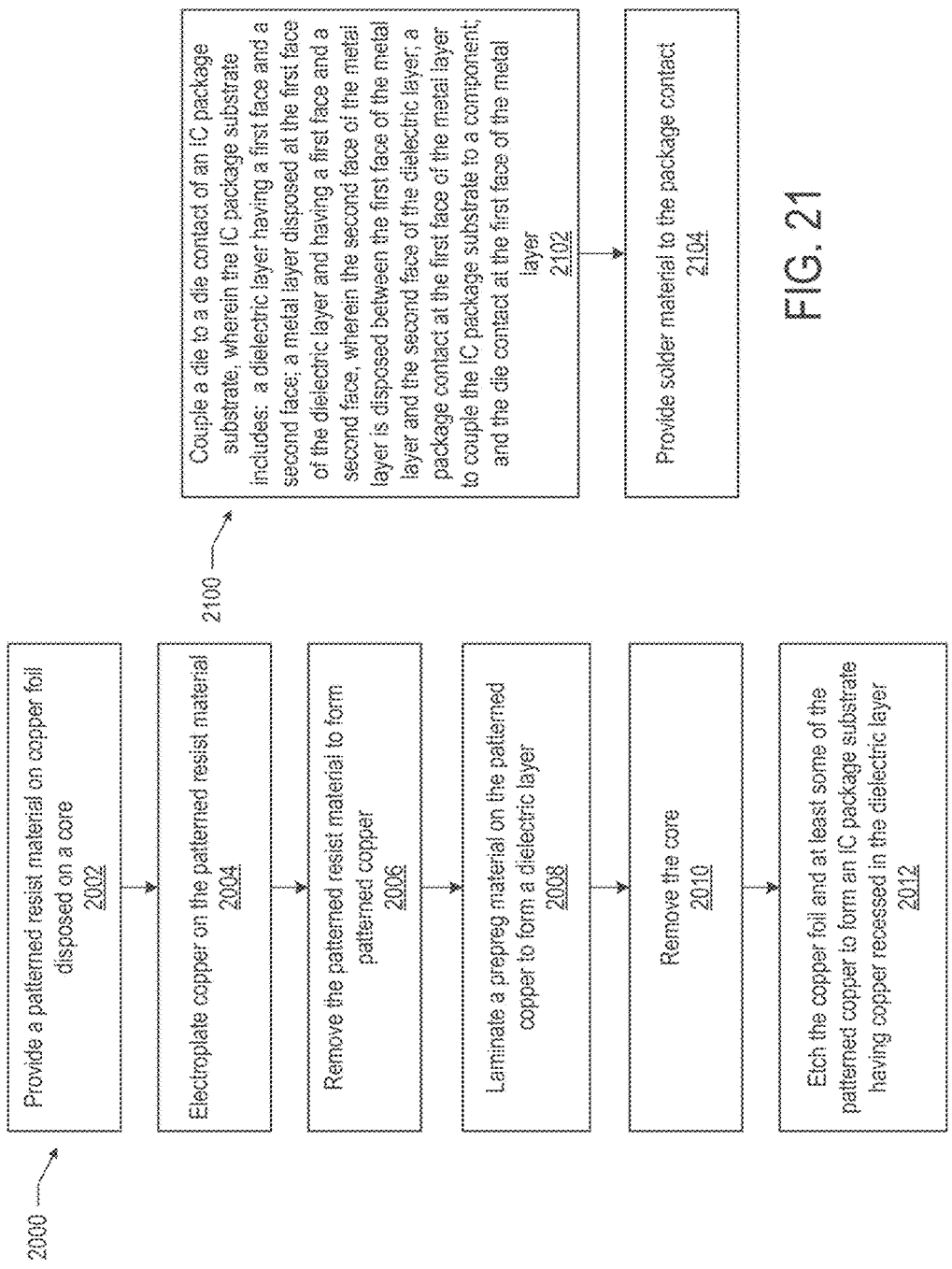

INTEGRATED CIRCUIT PACKAGE STRUCTURES

TECHNICAL FIELD

The present disclosure relates generally to integrated circuits, and more particularly, to integrated circuit package structures.

BACKGROUND

Conventional integrated circuit (IC) package substrates include multiple metal and dielectric layers to route electrical signals from a die on top of the substrate to a motherboard coupled to the bottom of the substrate. Vertical vias through the dielectric layers provide pathways for the electrical signals between metal layers.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2 is a bottom view of the IC package of the IC package structure of FIG. 1, in accordance with various embodiments.

FIG. 3 is a detailed view of the coupling between the IC package substrate and the die of the IC package structure of FIG. 1, in accordance with various embodiments.

FIGS. 4-12 illustrate various stages in the manufacture of the IC package substrate of the IC package structure of FIG. 1, in accordance with various embodiments.

FIGS. 13-16 illustrate various stages in the manufacture of the IC package structure of FIG. 1, in accordance with various embodiments.

FIG. 20 is a flow diagram of a method of manufacturing an IC package substrate, in accordance with various embodiments.

FIG. 21 is a flow diagram of a method of manufacturing an IC package, in accordance with various embodiments.

DETAILED DESCRIPTION

Figure 1:
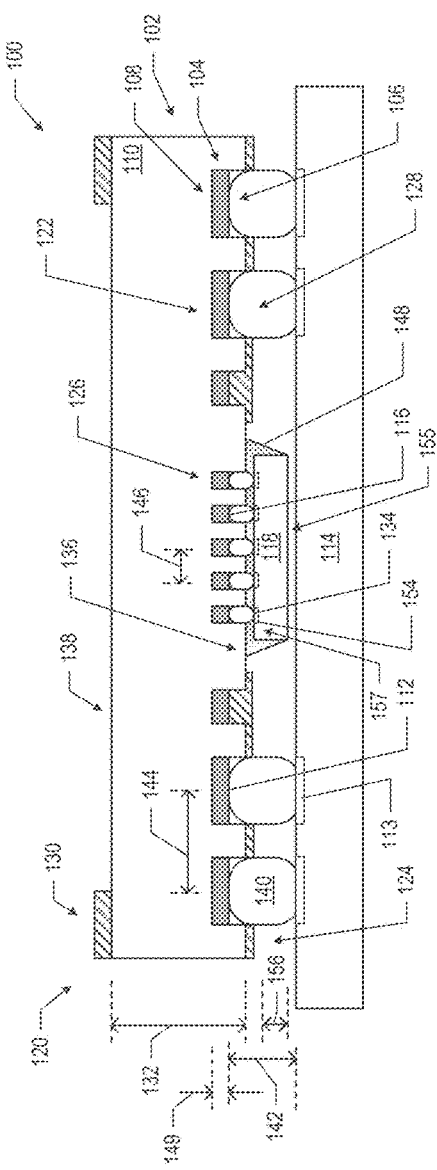
FIG. 1 is a side cross-sectional view of an integrated circuit (IC) package structure, in accordance with various embodiments.

Disclosed herein are integrated circuit (IC) package structures, and related devices and methods. In some embodiments, an IC package substrate may include: a dielectric layer having a first face and a second face; a metal layer disposed at the first face of the dielectric layer and having a first face and a second face, wherein the second face of the metal layer is disposed between the first face of the metal layer and the second face of the dielectric layer; a package contact at the first face of the metal layer to couple the IC package substrate to a component; and a die contact at the first face of the metal layer to couple a die to the IC package substrate.

Conventional IC packaging techniques have limited the progress of next-generation computing devices toward smaller form factors. For example, the conventional IC packages discussed above, which electrically couple a die on one side of a substrate to a motherboard on the other side of the substrate, may be difficult to reduce below a critical thickness due to the thermal warpage issues that arise from very thin substrates. Another packaging technology, quad-flat no-lead (QFN) packages, utilize wire bonding to horizontally couple a die to a lead frame. The performance and reliability of wire bonding, however, is conventionally less than that achievable by "flip chip" architectures.

Various ones of the embodiments disclosed herein may provide IC packages with lower-cost and/or smaller form factors than conventional IC packages. In particular, various ones of the embodiments disclosed herein may be used in mobile and/or networking devices to enable small and thin form factor devices, which can provide increased computing power. Some of the embodiments disclosed herein may provide a single metal layer, low-cost, flip chip packaging architecture with smaller form factors than conventional IC packages. Embodiments of IC packages having a single metal layer and a single dielectric layer may have reduced material costs, as well as reduce manufacturing costs (e.g., because no vias may need to be formed). Various ones of the manufacturing techniques disclosed herein enable the manufacture of substrates for these IC packages using a symmetric process on the panel level with a "peelable" core, enabling twice the number of IC package substrates to be readily formed.

Many embodiments are disclosed herein, each having various advantages. For example, some of the embodiments disclosed herein include an IC package substrate having a single metal layer formed as an embedded trace substrate (ETS) in a single dielectric layer, with a die coupled to the IC package substrate using a "solder on die" or "solder on package" technique. Since such IC package substrates only include a single metal layer, no via drilling may be needed. Some embodiments may include ball grid array (BGA) balls and the die on the same side of the IC package substrate, and may therefore have a smaller height than conventional flip chip packages. Various embodiments may provide a low-cost, low-complexity alternative to conventional packages with small form factors, such as QFNs. Moreover, various embodiments disclosed herein may provide new architectures that may be manufactured by existing tool sets, reducing the cost and complexity of manufacturing start-up. A number of other embodiments, including IC package substrates, IC packages, IC package structures, computing devices, and manufacturing methods, are discussed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

FIG. 1 is a side cross-sectional view of an IC package structure 100, in accordance with various embodiments. The IC package structure 100 may include an IC package 120 coupled to a component 114. The component 114 may be a printed circuit board (e.g., a motherboard), another IC package (e.g., in a package-on-package configuration), an interposer, or any other suitable component. The IC package 120 may include an IC package substrate 102 coupled to a die 118. As shown in FIG. 1, the die 118 and the component 114 may be disposed at a same "side" of the IC package substrate 102, in contrast to conventional package structures in which a package substrate is disposed between a die and a component (e.g., printed circuit board).

The IC package substrate 102 may include a dielectric layer 110 having a first face 136 and a second face 138. In some embodiments, the dielectric layer 110 may have a thickness 132, as measured between the first face 136 and the second face 138 as shown in FIG. 1, between 50 and 200 µm. The dielectric layer 110 may be formed from a prepreg material, in which composite fibers are "pre-impregnated" with a resin material (e.g., epoxy). A prepreg material may be cured to form the dielectric layer 110 by the application of pressure and/or heat. In some embodiments, the prepreg material may have a dielectric loss tangent less than 0.007 to support high frequency signaling.

The IC package substrate 102 may also include a metal layer 104 disposed at the first face 136 of the dielectric layer 110, and may have its own first face 106 and second face 108. The second face 108 of the metal layer 104 may be disposed between the first face 106 of the metal layer 104 and the second face 138 of the dielectric layer 110. The metal layer 104 may include a conductive material, such as copper, arranged in conductive traces to provide electrical pathways within the metal layer 104, as known in the art. In some embodiments, the metal layer 104 may have a thickness 149, as measured between the first face 106 and the second face 108 as shown in FIG. 1, between 10 and 20 µm (e.g., 15 µm).

The IC package substrate 102 may include package contacts 112 at the first face 106 of the metal layer 104 to couple the IC package substrate 102 to the component 114. The IC package substrate 102 may also include die contacts 116 at the first face 106 of the metal layer 104 to couple the die 118 to the IC package substrate 102. The package contacts 112 and the die contacts 116 may be portions of the metal layer 104 not covered by the dielectric layer 110 or a solder resist, as discussed below.

In some embodiments, the metal layer 104 may be recessed in the dielectric layer 110. In particular, the package contacts 112 and the die contacts 116 may be recessed in the dielectric layer 110 such that the first face 106 of the metal layer 104 is set back from at least some of the first face 136 of the dielectric layer 110. This setback may be any suitable distance (e.g., between 0.5 and 5 µm). As shown in FIG. 1, the first face 136 may include recesses 126 in which the die contacts 116 are disposed, and may also include recesses 122 in which the package contacts 112 are disposed. In some embodiments, the metal layer 104 (including the package contacts 112 and the die contacts 116) may be formed using ETS techniques, as discussed in further detail below with reference to FIGS. 4-11. Recessed contacts, such as those formed using ETS techniques, may enable increased contact density relative to conventional "protruded trace" techniques, and thus may be particularly appropriate for small form factor devices.

Portions of die solder material 134 may be disposed between the die 118 and the metal layer 104 to electrically couple the die 118 to the metal layer 104. For example, as illustrated in FIG. 1, the die solder material 134 may electrically couple different conductive contacts 154 of the die 118 to corresponding ones of the die contacts 116. In some embodiments, the portions of the die solder material 134 may be controlled collapse chip connection (C4, or "flip chip") solder bumps. The pitch of the portions of the die solder material 134 may be equal to the pitch 146 of the die contacts 116. In some embodiments, the pitch 146 may be between 50 µm and 200 µm. The pitch 146 may be selected based on the product requirements and the solder bump pattern under the die 118, among other factors. For example, the solder bump pattern under the die 118 may include peripheral solder bumps (e.g., 1-2 two rows of solder bumps) only, or a patterned array of solder bumps under the whole die 118.

Portions of package solder material 140 may be disposed on the metal layer 104 (e.g., on the package contacts 112), and may be disposed between the metal layer 104 and the component 114 (e.g., a PCB). For example, the package solder material 140 may electrically couple different conductive contacts 113 of the component 114 to corresponding ones of the package contacts 112. In some embodiments, the portions of the package solder material 140 may be BGA solder balls. BGA solder balls may have any suitable composition; for example, BGA solder may include tin, silver, and/or copper, and may further include small amounts of nickel to improve shock resistance.

In some such embodiments, the BGA solder balls may extend away from the metal layer 104 with a height 142 between 100 and 350 µm. The height 142 may be selected based on the pitch 144. Some example embodiments may have a pitch 144 of 0.35 mm and a height 142 between 90 µm and 110 µm (e.g., 100 µm), a pitch 144 of 0.5 mm and a height 142 between 160 µm and 200 µm (e.g., 180 µm), or a pitch 144 of 0.65 mm and a height 142 between 325 and 375 µm (e.g., 350 µm). Some example embodiments may have a pitch 144 between 0.30 and 0.65 mm and a height 142 between 90 and 375 um.

As illustrated in FIG. 1, the height 142 may be greater than the distance between the first face 106 of the metal layer 104 and the face 155 of the die 118 (opposite to the face 157 at which the conductive contacts 154 are disposed). Thus, the die 118 may "fit" in the space between the IC package substrate 102 and the component 114 when the IC package substrate 102 is coupled to the component 114 with the package solder material 140. For example, in some embodiments, the height 156 of the die 118, as measured between the faces 155 and 157, may be between 50 and 300 µm. Since the die 118 fits in the space between the IC package substrate 102 and the component 114, the height 156 of the die 118 may not contribute to the thickness of the IC package 120 (in contrast to conventional flip chip packages). The pitch of the portions of the package solder material 140 may be equal to the pitch 144 of the package contacts 112. In some embodiments, the pitch 144 may be between 300 µm and 650 µm (e.g., 500 µm) and may depend on the type of component 114 (e.g., the type of PCB).

In some embodiments, a first solder resist layer 124 may be disposed at the first face 136 of the dielectric layer 110, and a second solder resist layer 130 may be disposed at the second face 138 of the dielectric layer 110 (such that the dielectric layer 110 is disposed between the first solder resist layer 124 and the second solder resist layer 130). In some embodiments, as illustrated in FIG. 1, the first solder resist layer 124 may be located between adjacent portions of the package solder material 140, but not between adjacent portions of the die solder material 134. In particular, the first solder resist layer 124 may include openings 128 corresponding to the package contacts 112, but no solder resist may be present in the "shadow" of the die 118.

In other embodiments, the first solder resist layer 124 may be located between adjacent portions of the package solder material 140, and also between adjacent portions of the die solder material 134 (the first solder resist layer 124 is not shown between adjacent portions of the die solder material 134 in FIG. 1). In such embodiments, the first solder resist layer 124 may include openings 128 corresponding to the package contacts 112, as well as openings (not illustrated in FIG. 1) corresponding to the die contacts 116 such that solder resist of the first solder resist layer 124 is disposed between the die 118 and the dielectric layer 110. Such embodiments may be particularly suitable when a "solder on package" technique is used to couple the die 118 to the IC package substrate 102. An example of such a technique is discussed below with reference to FIGS. 15-17.

In still other embodiments, no solder resist may be disposed at the first face 136 of the dielectric layer 110, and thus no first solder resist layer 124 may be included in the IC package structure 100. In some embodiments, no solder resist may be disposed at the second face 138 of the dielectric layer 110, and thus no second solder resist layer 130 may be included in the IC package structure 100. In embodiments in which the solder resist layer 130 is included in the IC package structure 100, it may be arranged on the second face 138 in order to counterbalance any warping of the IC package substrate 102 that may occur as a result of the first solder resist layer 124. In particular, since the presence of solder resist may be a strong contributor to thermal warping, the first solder resist layer 124 may be designed to use solder resist only in areas where it is particularly useful (e.g., to protect particular copper traces), and the second solder resist layer 130 may be designed with solder resist in particular locations to counterbalance any thermal warping experienced by the IC package structure 100 due to the first solder resist layer 124. The determination of such designs may depend on the geometry and materials of the IC package structure 100, as known in the art. In some embodiments, for example, the first solder resist layer 124 and a second solder resist layer 130 may have symmetric designs of solder resist across the dielectric layer 110; in other embodiments (such as the embodiment illustrated in FIG. 1), the first solder resist layer 124 and the second solder resist layer 130 may have asymmetric designs of solder resist. In embodiments in which solder resist is included in the IC package structure 100, the thickness of the solder resist may be any suitable thickness; for example, in some embodiments, the solder resist may be 15-25 µm thick (e.g., 20 µm).

In some embodiments, an underfill material 148 may be disposed between the die 118 and the IC package substrate 102. The underfill material 148 may strengthen the mechanical coupling between the die 118 and the IC package substrate 102, and improve the reliability of the electrical coupling between the die 118 and the IC package substrate 102, as known in the art. In some embodiments, the underfill material 148 may have filler particle loading ranging between 10% and 50% to modulate the viscosity, coefficient of thermal expansion, and modulus to enable robust attachment between the die 118 and the IC package substrate 102, and to provide interconnect protection. In some embodiments, no underfill material 148 may be included in the IC package structure 100.

The metal layer 104 of the IC package substrate 102 may be the only metal layer in the IC package substrate 102. In particular, there may be no other metal layers in the IC package substrate 102 to which the metal layer 104 may be coupled, and thus no "vertical" vias may be needed in the dielectric layer 110 to conductively couple one metal layer to another. The dielectric layer 110 may be the only dielectric layer in the IC package substrate 102. The "elimination" of vias may both reduce manufacturing cost (by eliminating manufacturing process steps and materials) and improve manufacturing yields (by making it easier to visually inspect and probe the IC package substrate for faults, relative to multi-metal layer substrates whose interior metal cannot be visually evaluated and must be probed with designated contact points).

The IC package substrate 102 and the die 118 of FIG. 1 may have any desired footprint. For example, FIG. 2 is a bottom view of the IC package 120 of the IC package structure 100 of FIG. 1, in accordance with various embodiments. The package solder material 140 and the die 118 are shown disposed on the IC package substrate 102. The footprint of the die 118 may have a first dimension 158 and a second dimension 162. In some embodiments, the first dimension 158 and/or the second dimension 162 may be less than 5 mm; for example, between 1 and 4 mm, or between 1.5 and 2.5 mm. In another example, the first dimension 158 may be between 2 and 2.25 mm and the second dimension 162 may be between 2 and 2.25 mm. The footprint of the IC package substrate 102 may have a first dimension 160 and a second dimension 164. In some embodiments, the first dimension 160 and/or the second dimension 164 may be less than 10 mm; for example, between 2 and 7 mm, or between 3 and 6 mm. For example, the first dimension 160 may be between 3 and 4 mm, and the second dimension 164 may be between 4.25 and 4.75 mm.

Although a particular number of portions of the package solder material 140 is illustrated in FIG. 2, this is only illustrative, and any suitable number of portions of the package solder material 140 (each providing a point of electrical connection between the IC package 120 and the component 114) may be used, given the footprint of the IC package substrate 102 and the needs of the computing application. For example, in some embodiments, the IC package 120 may include 20-80 portions of the package solder material 140 (e.g., 40-70 portions).

In some embodiments, the conductive contacts 154 on the die 118 may be copper bumps. FIG. 3 is a detailed view of the coupling between the IC package substrate 102 and such a die 118 of the IC package structure 100 of FIG. 1, in accordance with various embodiments. In particular, FIG. 3 illustrates the geometry of the coupling between the die contact 116 of the metal layer 104 (recessed in the dielectric layer 110), the die solder material 134, and copper bumps serving as the conductive contacts 154 of the die 118. The conductive contacts 154 may be conductively coupled to a metal layer 150 of the die 118 through vias 152, as shown. In some embodiments, the conductive contact 154 and the die contact 116 may have approximately the same width 173. The width 173 may take any suitable value; for example, in some embodiments, the width 173 may be between 30 and 90 µm. The width 173 may depend on the pitch 146; for example, one particular embodiment may have a pitch 146 of 50 µm and a width 173 between 25 and 35 µm (e.g., 30 µm), and another particular embodiment may have a pitch of 150 µm and a width 173 between 80 and 100 µm (e.g., 90 µm). The die solder material 134 may interact with an exposed die contact 116 formed of copper (e.g., a copper pad) during the chip attach process to form a copper-tin intermetallic compound having a thickness on the order of 1-2 µm.

The IC package structures 100 disclosed herein, and their constituent parts, may be formed using any suitable manufacturing techniques. For example, FIGS. 4-12 illustrate various stages in the manufacture of the IC package substrate 102 of the IC package structure 100 of FIG. 1, in accordance with various embodiments. While FIGS. 4-12 illustrate particular methods for manufacturing the IC package substrate 102 of FIG. 1, any manufacturing techniques that can be used to form an IC package substrate 102, in accordance with the present disclosure, may be used. The elements of the assemblies discussed below with reference to FIGS. 4-12 may be implemented in accordance with any of the embodiments of the corresponding elements discussed herein (e.g., discussed above with reference to FIGS. 1-3), for example.

Figure 4:
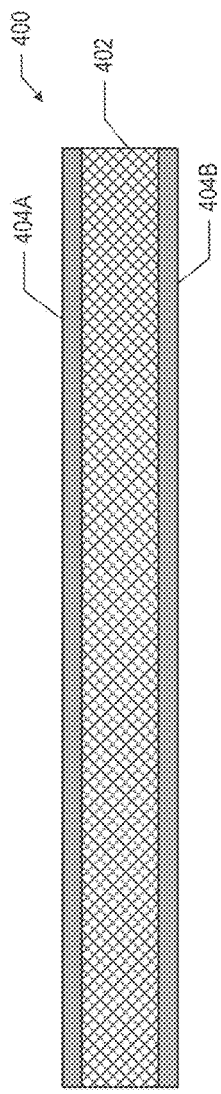

FIG. 4 illustrates an assembly 400 including a core 402 and copper foil 404A and 404B disposed on opposite faces of the core 402. As discussed in further detail below, the core 402 may be a sacrificial core, and two IC package substrates 102 may be formed on the core 402.

Figure 5:
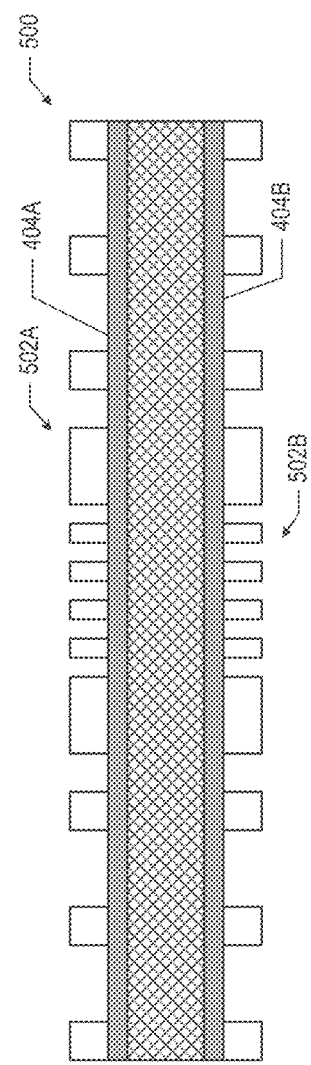

FIG. 5 illustrates an assembly 500 subsequent to providing a patterned resist material 502A and 502B on the copper foil 404A and 404B, respectively, of the assembly 400 (FIG. 4). The patterned resist material 502A and 502B may be a dry film resist, and may be formed using conventional lithography techniques, and are thus not discussed in detail herein. The pattern of the patterned resist material 502A and 502B may act as a mask for copper plating and may correspond to the metal layer 104 of the IC package substrate 102 of FIG. 1, as discussed in further detail below.

Figure 6:
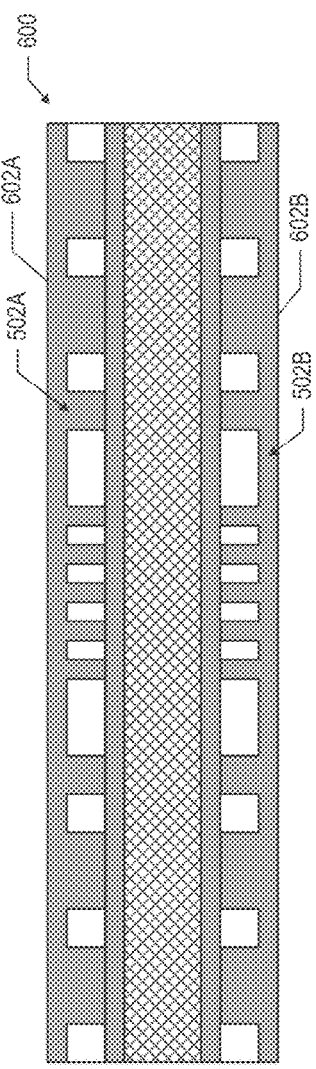

FIG. 6 illustrates an assembly 600 subsequent to electroplating copper 602A and 602B on the patterned resist material 502A and 502B and the exposed copper foil 404A and 404B of the assembly 500 (FIG. 5). The electroplated copper 602A and 602B may extend above the patterned resist material 502A and 502B, respectively, as shown.

Figure 7:
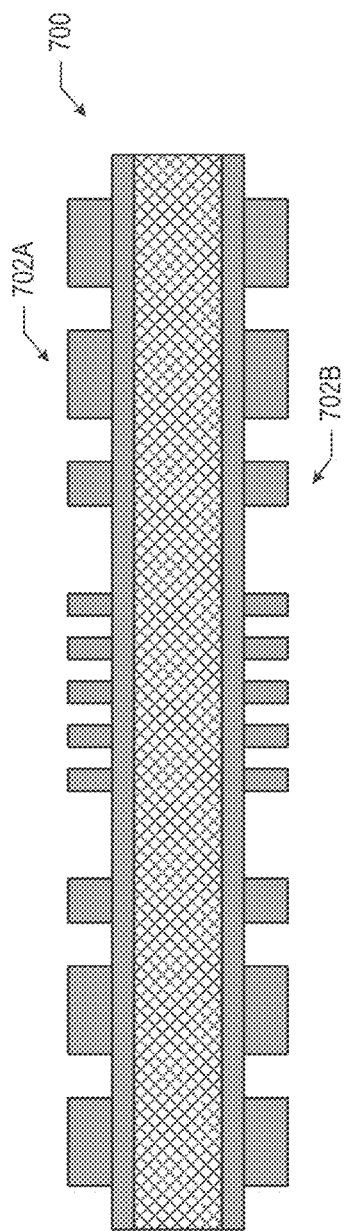

FIG. 7 illustrates an assembly 700 subsequent to removing the patterned resist material 502A and 502B of the assembly 600 (FIG. 6) to form patterned copper 702A and 702B, respectively. The patterned copper 702A and 702B may provide the metal layer 104 of the IC package substrate 102 of FIG. 1, as discussed in further detail below.

Figure 8:
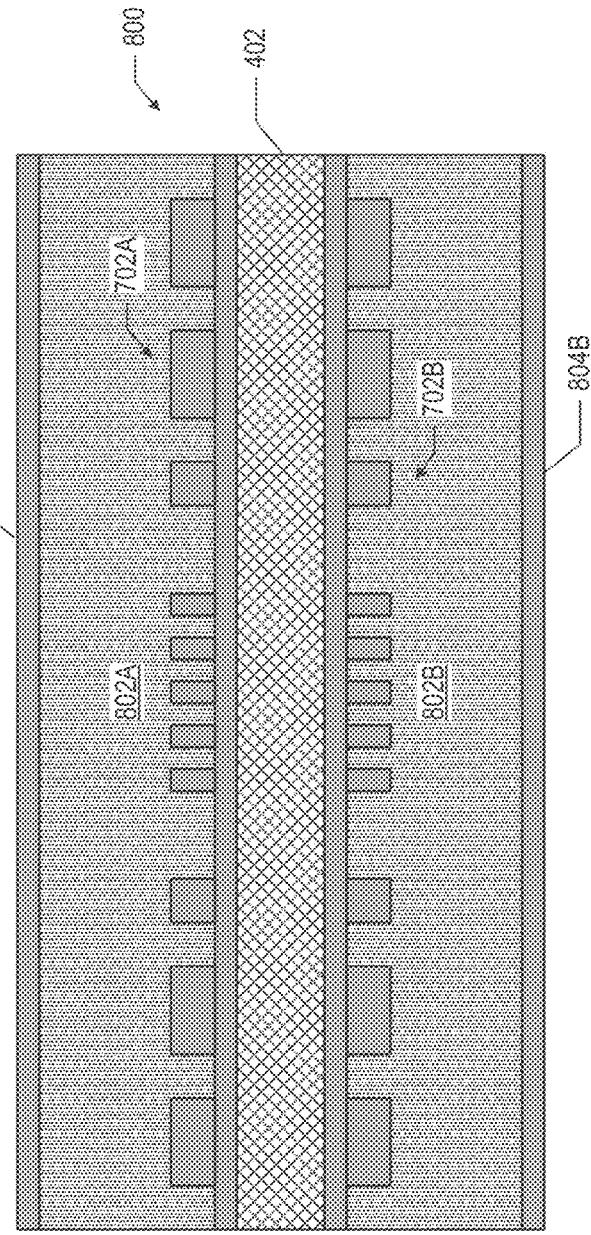

FIG. 8 illustrates an assembly 800 subsequent to providing a prepreg material 802A and 802B on the patterned copper 702A and 702B of the assembly 700 (FIG. 7). The prepreg material 802A and 802B may be faced with copper foil 804A and 804B, respectively.

FIG. 9 illustrates an assembly 900 subsequent to laminating the prepreg material 802A and 802B of the assembly 800 (FIG. 8) using pressure and/or heat to cure the matrix in the prepreg material 802A and 802B and form dielectric layers 110A and 110B, respectively. Lamination may be performed using a hot press, for example.

FIG. 10 illustrates an assembly 1000 subsequent to removing the core 402 and "depaneling" the structures on either side of the core 402 of the assembly 900 (FIG. 9); two copies of the assembly 1000 are formed upon removal of the core 402, but only one is illustrated in FIG. 10. The assembly 1000 includes the copper foil 404, the patterned copper 702, the dielectric layer 110, and the copper foil 804.

FIG. 11 illustrates an assembly 1100 subsequent to etching the copper foil 404, the copper foil 804, and at least some of the patterned copper 702 to form the metal layer 104. As illustrated in FIG. 11, the patterned copper 702 may be etched so that the metal layer 104 is recessed in the dielectric layer 110, as discussed above with reference to FIG. 1. The recessing of the metal layer 104 in the dielectric layer 110 may be referred to forming an ETS structure, as indicated above. The assembly 1100 may provide an embodiment of the IC package substrate 102.

FIG. 12 illustrates an assembly 1200 subsequent to providing the first solder resist layer 124 and the second solder resist layer 130 to the assembly 1100 (FIG. 11). The first solder resist layer may include the openings 128 corresponding to the package contacts 112 of the metal layer 104, and no solder resist may be disposed proximate to the die contacts 116, as discussed above with reference to the embodiment of FIG. 1. In other embodiments, the IC package substrate 102 may not include the first solder resist layer 124 and/or the second solder resist layer 130. In still other embodiments, the IC package substrate 102 may include solder resist proximate to the die contacts 116 (e.g., as discussed below with reference to FIGS. 17-19). The first solder resist layer 124 and/or the second solder resist layer 130 may be laminated and patterned in accordance with known techniques. The assembly 1200 may provide an embodiment of the IC package substrate 102.

FIGS. 13-16 illustrate various stages in the manufacture (e.g., assembly) of the IC package structure 100 of FIG. 1, in accordance with various embodiments. While FIGS. 13-16 illustrate particular methods for manufacturing the IC package structure 100 of FIG. 1, any manufacturing techniques that can be used to form an IC package structure 100, in accordance with the present disclosure, may be used. The elements of the assemblies discussed below with reference to FIGS. 13-16 may be implemented in accordance with any of the embodiments of the corresponding elements discussed herein (e.g., discussed above with reference to FIGS. 1-3), for example.

FIG. 13 illustrates an assembly 1300 subsequent to providing package solder material 140 to the package contacts 112 of the IC package substrate 102 (see, e.g., FIGS. 1 and 12). In some embodiments, the package solder material 140 may be BGA balls, as discussed above. The assembly 1300 may provide an embodiment of the IC package substrate 102.

FIG. 14 illustrates an assembly 1400 subsequent to coupling the die 118 to the die contacts 116 of the assembly 1300 (FIG. 13) with the die solder material 134. In particular, as discussed above with reference to FIG. 1, the die solder material 134 may electrically couple the die contacts 116 and corresponding conductive contacts 154 in the die 118. The die 118 may be formed from a wafer of multiple dies by performing wafer taper, thinning, laser scribing, and sawing processes, as known in the art. In some embodiments, the die 118 may be provided with the die solder material 134 prior to coupling the die 118 to the assembly 1300; these embodiments may be referred to as "solder on die" embodiments. In solder-on-die embodiments, the die solder material 134 may be provided as solder bumps on the die 118, and the die 118 (with its solder bumps) may be brought into contact with and coupled to the die contacts 116 of the assembly 1300. In other embodiments, the die solder material 134 may be provided on the die contacts 116 before the die 118 is coupled to the assembly 1300; these embodiments may be referred to as "solder on package" embodiments. In solder-on-package embodiments, the die solder material 134 may be provided as solder bumps on the die contacts 116, and the die 118 may be brought into contact with and coupled to the die contacts 116 via the solder bumps. Further examples of solder-on-package embodiments are discussed below with reference to FIGS. 17-19. In both solder-on-package and solder-on-die embodiments, the die solder material 134 may undergo a reflow process to couple the die 118 to the die contacts 116 (which may include, e.g., any suitable deflux or other cleaning or preparation operations). The assembly 1400 may provide an embodiment of the IC package 120.

Figure 15:
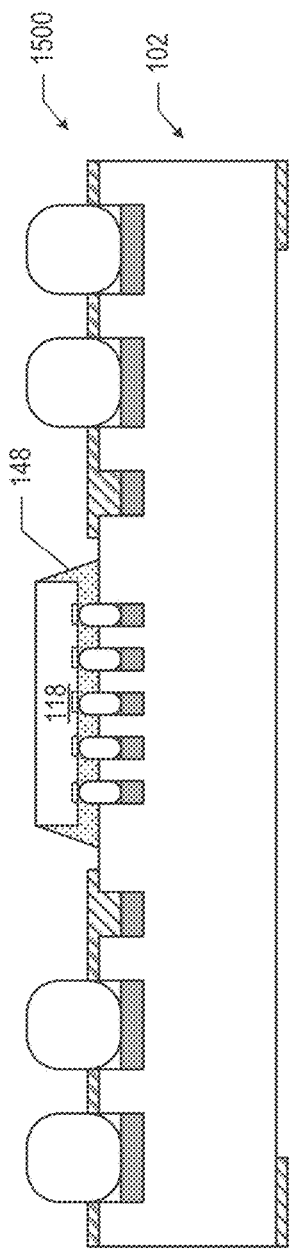

FIG. 15 illustrates an assembly 1500 subsequent to providing underfill material 148 between the die 118 and the IC package substrate 102 of the assembly 1400 (FIG. 14). As noted above, in some embodiments, no underfill material 148 may be included. The assembly 1500 may provide an embodiment of the IC package 120. In some embodiments, the assemblies 400-1500 discussed above may be formed in parallel with multiple other such assemblies in a matrix (which may be referred to as a "strip"), and may be singulated from each other prior to coupling the assembly 1500 to the component 114 (e.g., as discussed below with reference to FIG. 16). More generally, the IC package substrates 102 and/or the IC packages 120 discussed herein may be formed in parallel as part of a matrix of substrates and/or packages, and may be singulated from each other prior to further processing.

Figure 16:
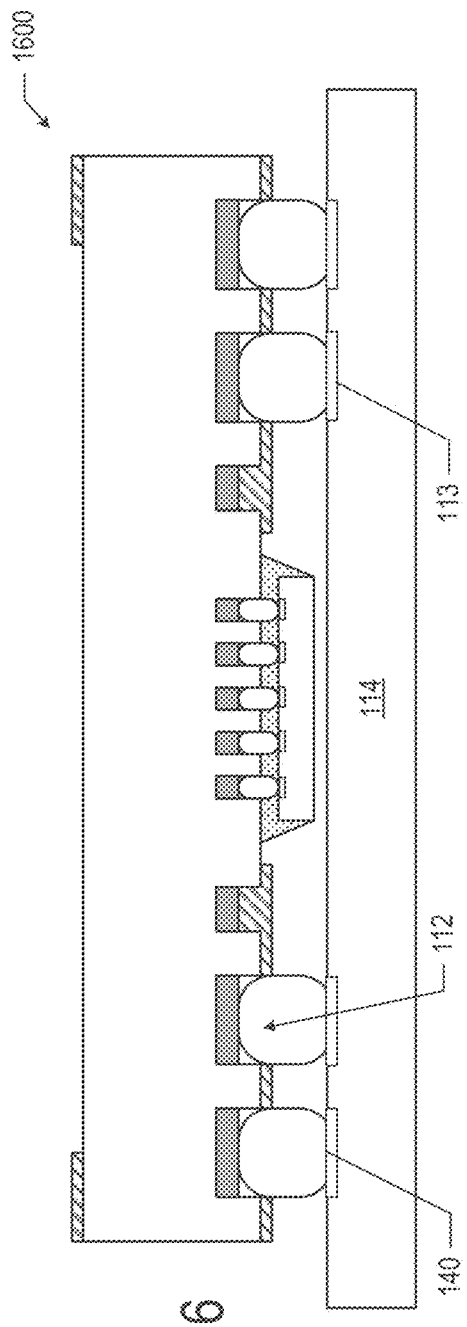

FIG. 16 illustrates an assembly 1600 subsequent to coupling the assembly 1500 (FIG. 15) to the component 114 with the package solder material 140. In particular, as discussed above with reference to FIG. 1, the package solder material 140 may electrically couple the package contacts 112 and corresponding conductive contacts 113 in the component 114. The assembly 1600 may provide an embodiment of the IC package structure 100.

Figure 17:
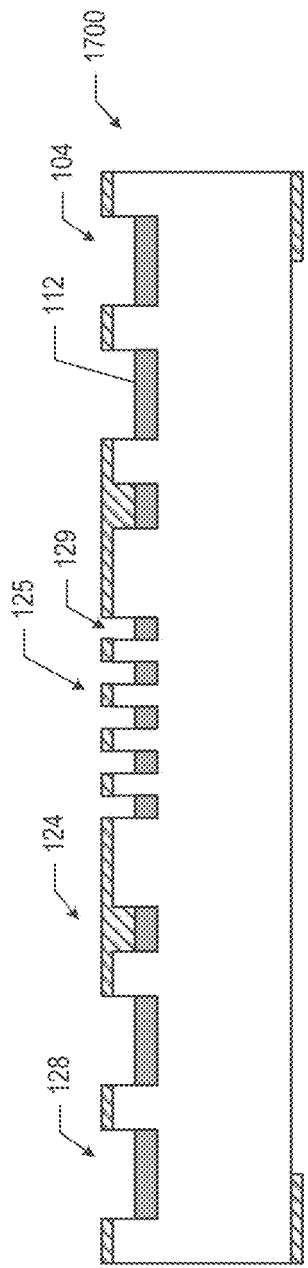
FIGS. 17-19 illustrate various stages in the manufacture of a variation of the IC package structure of FIG. 1, in accordance with various embodiments.
Figure 18:
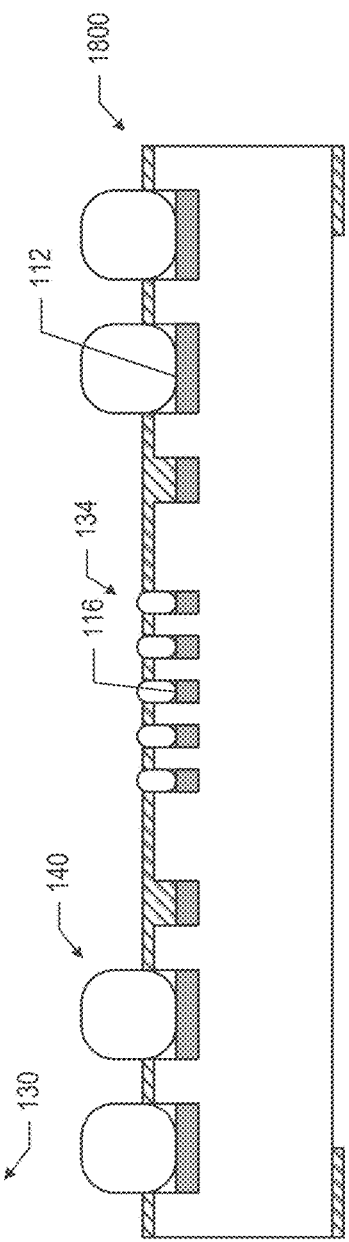
Figure 19:
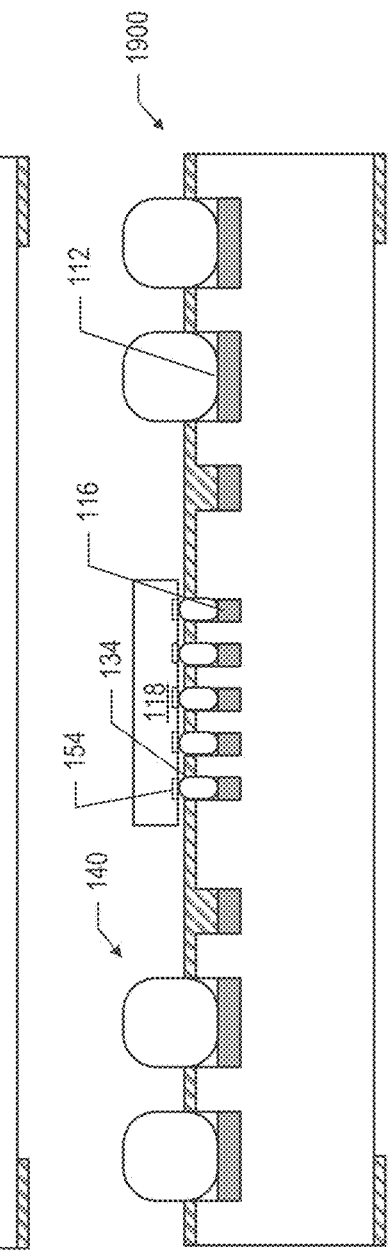

As discussed above, in some embodiments, the first solder resist layer 134 may include solder resist disposed between the die 118 and the IC package substrate 102. FIGS. 17-19 illustrate various alternate stages in the manufacture of an IC package structure 100 including such solder resist, in accordance with various embodiments. The elements of the assemblies discussed below with reference to FIGS. 17-19 may be implemented in accordance with any of the embodiments of the corresponding elements discussed herein (e.g., discussed above with reference to FIGS. 1-3), for example.

FIG. 17 illustrates an assembly 1700 subsequent to providing the first solder resist layer 124 and the second solder resist layer 130 to the assembly 1100 (FIG. 11), wherein the first solder resist layer 124 includes additional solder resist 125 disposed around the die contacts 116. In particular, the first solder resist layer 124 may include openings 129 in the additional solder resist 125 corresponding to the die contacts 116 of the metal layer 104. The assembly 1700 may provide an embodiment of the IC package substrate 102. As noted above, in some embodiments, the second solder resist layer 130 may not be included.

FIG. 18 illustrates an assembly 1800 subsequent to providing package solder material 140 to the package contacts 112 of the IC package substrate 102 of FIG. 17, and providing die solder material 134 to the die contacts 116 of the IC package substrate 102 of FIG. 17. In some embodiments, the package solder material 140 may be BGA balls, and the die solder material 134 may be solder bumps, as discussed above. The assembly 1800 may provide an embodiment of the IC package substrate 102.

FIG. 19 illustrates an assembly 1900 subsequent to coupling the die 118 to the die contacts 116 of the assembly 1800 (FIG. 18) with the die solder material 134. In particular, as discussed above with reference to FIG. 1, the die solder material 134 may electrically couple the die contacts 116 and corresponding conductive contacts 154 in the die 118. The embodiment of FIGS. 17-19 may represent a "solder on package" embodiment, as discussed above. The assembly 1900 may provide an embodiment of the IC package 120. The assembly 1900 may be further processed in accordance with the operations discussed above with reference to FIGS. 15-16 to form an IC package structure 100.

FIG. 20 is a flow diagram of a method 2000 of manufacturing an IC package substrate, in accordance with various embodiments. While the operations of the method 2000 are arranged in a particular order in FIG. 20 and illustrated once each, in various embodiments, one or more of the operations may be repeated, performed out of order, or performed in parallel, as suitable. The elements of the operations discussed below with reference to FIG. 20 may be implemented in accordance with any of the embodiments of the corresponding elements discussed herein (e.g., discussed above with reference to FIGS. 1-3), for example.

At 2002, a patterned resist material may be provided on copper foil disposed on a core. For example, as discussed above with reference to FIG. 5, a patterned resist material 502 may be provided on copper foil 404 disposed on a core 402. In some embodiments, the operations discussed with reference to 2002 (and 2004-2008) may be performed on opposing faces of a core, as discussed above with reference to FIGS. 4-9.

At 2004, copper may be electroplated on the patterned resist material of 2002. For example, as discussed above with reference to FIG. 6, copper 602 may be electroplated on the patterned resist material 502.

At 2006, the patterned resist material of 2002 may be removed to form patterned copper. For example, as discussed above with reference to FIG. 7, the patterned resist material 502 may be removed to form patterned copper 702.

At 2008, a prepreg material may be laminated on the patterned copper of 2006. For example, as discussed above with reference to FIGS. 8 and 9, a prepreg material 802 may be laminated on the patterned copper 702 to form a dielectric layer 110.

At 2010, after laminating the prepreg material at 2008, the core may be removed. For example, as discussed above with reference to FIG. 10, the structures on either side of the core 402 may be depaneled from the core 402.

At 2012, the copper foil (e.g., of 2002) and at least some of the patterned copper (e.g., of 2006) may be etched to form an IC package substrate having copper recessed in the dielectric layer of 2010. For example, as discussed above with reference to FIG. 11, the copper foil 404 (and the copper foil 804 that accompanied the prepreg material 802) and at least some of the patterned copper 702 may be etched to form an IC package substrate (e.g., the assembly 1100) having a metal layer 104 including the copper recessed in the dielectric layer 110.

In some embodiments, the method 2000 may further include providing solder resist to the one or more opposing faces of the dielectric layer (e.g., the first face 136 or the second face 138 of the dielectric layer 110). The method 2000 may include any other additional manufacturing operations in accordance with the embodiments disclosed herein.

FIG. 21 is a flow diagram of a method 2100 of manufacturing an IC package, in accordance with various embodiments. While the operations of the method 2100 are arranged in a particular order in FIG. 21 and illustrated once each, in various embodiments, one or more of the operations may be repeated, performed out of order, or performed in parallel, as suitable. The elements of the operations discussed below with reference to FIG. 21 may be implemented in accordance with any of the embodiments of the corresponding elements discussed herein (e.g., discussed above with reference to FIGS. 1-3), for example.

At 2102, a die may be coupled to a die contact of an IC package substrate, wherein the IC package substrate includes: a dielectric layer having a first face and a second face; a metal layer disposed at the first face of the dielectric layer and having a first face and a second face, wherein the second face of the metal layer is disposed between the first face of the metal layer and the second face of the dielectric layer; a package contact at the first face of the metal layer to couple the IC package to a component; and the die contact at the first face of the metal layer. For example, as discussed above with reference to FIGS. 1, 14, and 19, a die 118 may be coupled to a die contact 116 of an IC package substrate 102, wherein the IC package substrate 102 includes: a dielectric layer 110 having a first face 136 and a second face 138; a metal layer 104 disposed at the first face 136 of the dielectric layer 110 and having a first face 106 and a second face 108, wherein the second face 108 of the metal layer 104 is disposed between the first face 106 of the metal layer 104 and the second face 138 of the dielectric layer 110; a package contact 112 at the first face 106 of the metal layer 104 to couple the IC package substrate 102 to component 114; and the die contact 116 at the first face 106 of the metal layer 104. In "solder on die" embodiments, the die of 2102 may have solder bumps to couple to the IC package; in "solder on package" embodiments, solder bumps may be provided to the die contacts, then used to couple the die contacts with the die.

At 2104, solder material may be provided to the package contact of the IC package substrate of 2102. For example, as discussed above with reference to FIGS. 1, 13, and 18, package solder material 140 may be provided to the package contact 112 of the IC package substrate 102.

In some embodiments, the method 2100 may further include coupling the IC package substrate to a component with the solder material of 2104 (e.g., coupling the IC package substrate 102 to the component 114 with the package solder material 140). The method 2100 may include any other additional manufacturing operations in accordance with the embodiments disclosed herein.

Figure 22:
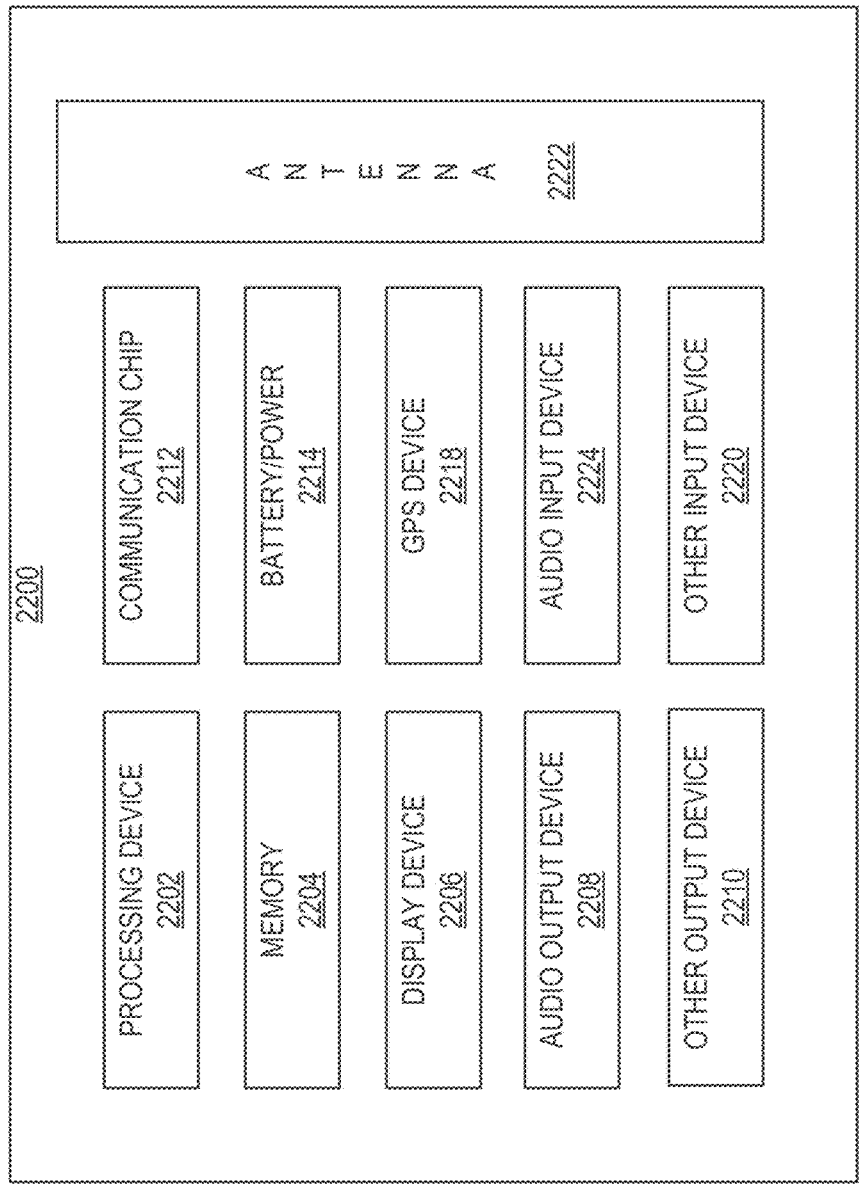
FIG. 22 is a block diagram of an example computing device that may include an IC package structure in accordance with the teachings of the present disclosure.

FIG. 22 is a block diagram of an example computing device 2200 that may include any of the embodiments of the IC package structure 100 disclosed herein. A number of elements are illustrated in FIG. 22 as included in the computing device 2200, but any one or more of these elements may be omitted or duplicated, as suitable for the application.

Additionally, in various embodiments, the computing device 2200 may not include one or more of the elements illustrated in FIG. 22, but the computing device 2200 may include interface circuitry for coupling to the one or more elements. For example, the computing device 2200 may not include a display device 2206, but may include display device interface circuitry (e.g., a connector and driver circuitry) to which a display device 2206 may be coupled. In another set of examples, the computing device 2200 may not include an audio input device 2224 or an audio output device 2208, but may include audio input or output device interface circuitry (e.g., connectors and supporting circuitry) to which an audio input device 2224 or audio output device 2208 may be coupled. Any one or more of the elements of the computing device 2200 may be included in an IC package structure 100 (e.g., in a die 118 included in the IC package structure 100). For example, any processing or memory devices in one or more of the elements of the computing device 2200 may be instantiated in a die 118, and included in an IC package 120; that IC package 120 may be coupled to a motherboard of the computing device 2200, or to another suitable component (e.g., an interposer).

The computing device 2200 may include a processing device 2202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2202 may include one or more digital signal processors (DSPs), application-specific integrated circuits (ASICs), central processing units (CPUs), graphics processing units (GPUs), cryptoprocessors, server processors, or any other suitable processing devices. The computing device 2200 may include a memory 2204, which may itself include one or more memory devices such as volatile memory (e.g., dynamic random access memory (DRAM)), non-volatile memory (e.g., read-only memory (ROM)), flash memory, solid state memory, and/or a hard drive.

In some embodiments, the computing device 2200 may include a communication chip 2212 (e.g., one or more communication chips). For example, the communication chip 2212 may be configured for managing wireless communications for the transfer of data to and from the computing device 2200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2212 may operate in accordance with a Global System for Mobile communication (GSM), General Packet Radio Service (GPRS), Universal Mobile Telecommunications System (UMTS), High Speed Packet Access (HSPA), Evolved HSPA (E-HSPA), or LTE network. The communication chip 2212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2212 may operate in accordance with other wireless protocols in other embodiments. The computing device 2200 may include an antenna 2222 to facilitate wireless communications and/or to receive other wireless communications (such as AM or FM radio transmissions).

In some embodiments, the communication chip 2212 may manage wired communications, such as electrical, optical, or any other suitable communication protocols (e.g., the Ethernet). As noted above, the communication chip 2212 may include multiple communication chips. For instance, a first communication chip 2212 may be dedicated to shorter-range wireless communications such as Wi-Fi or Bluetooth, and a second communication chip 2212 may be dedicated to longer-range wireless communications such as a global positioning system (GPS), EDGE, GPRS, CDMA, WiMAX, LTE, EV-DO, or others. In some embodiments, a first communication chip 2212 may be dedicated to wireless communications, and a second communication chip 2212 may be dedicated to wired communications.

The computing device 2200 may include battery/power circuitry 2214. The battery/power circuitry 2214 may include one or more energy storage devices (e.g., batteries or capacitors) and/or circuitry for coupling elements of the computing device 2200 to an energy source separate from the computing device 2200 (e.g., AC line power).

The computing device 2200 may include a display device 2206 (or corresponding interface circuitry, as discussed above). The display device 2206 may include any visual indicators, such as a heads-up display, a computer monitor, a projector, a touchscreen display, a liquid crystal display (LCD), a light-emitting diode display, or a flat panel display, for example.

The computing device 2200 may include an audio output device 2208 (or corresponding interface circuitry, as discussed above). The audio output device 2208 may include any device that generates an audible indicator, such as speakers, headsets, or earbuds, for example.

The computing device 2200 may include an audio input device 2224 (or corresponding interface circuitry, as discussed above). The audio input device 2224 may include any device that generates a signal representative of a sound, such as microphones, microphone arrays, or digital instruments (e.g., instruments having a musical instrument digital interface (MIDI) output).

The computing device 2200 may include a global positioning system (GPS) device 2218 (or corresponding interface circuitry, as discussed above). The GPS device 2218 may be in communication with a satellite-based system and may receive a location of the computing device 2200, as known in the art.

The computing device 2200 may include an other output device 2210 (or corresponding interface circuitry, as discussed above). Examples of the other output device 2210 may include an audio codec, a video codec, a printer, a wired or wireless transmitter for providing information to other devices, or an additional storage device.

The computing device 2200 may include an other input device 2220 (or corresponding interface circuitry, as discussed above). Examples of the other input device 2220 may include an accelerometer, a gyroscope, an image capture device, a keyboard, a cursor control device such as a mouse, a stylus, a touchpad, a bar code reader, a Quick Response (QR) code reader, any sensor, or a radio frequency identification (RFID) reader.

The following paragraphs describe examples of various ones of the embodiments disclosed herein.

Example 1 is an integrated circuit (IC) package substrate, including: a dielectric layer having a first face and a second face; a metal layer disposed at the first face of the dielectric layer and having a first face and a second face, wherein the second face of the metal layer is disposed between the first face of the metal layer and the second face of the dielectric layer; a package contact at the first face of the metal layer to couple the IC package substrate to a component; and a die contact at the first face of the metal layer to couple a die to the IC package substrate.

Example 2 may include the subject matter of Example 1, and may further specify that the metal layer is recessed in the dielectric layer.

Example 3 may include the subject matter of any of Examples 1-2, and may further specify that the package contact and the die contact are recessed in the dielectric layer.

Example 4 may include the subject matter of any of Examples 1-3, and may further specify that no vias are disposed in the dielectric layer.

Example 5 may include the subject matter of any of Examples 1-4, and may further specify that the metal layer is the only metal layer in the IC package substrate.

Example 6 may include the subject matter of any of Examples 1-5, and may further include a solder resist layer disposed at the first face of the dielectric layer and including an opening corresponding to the package contact.

Example 7 may include the subject matter of Example 6, and may further specify that the solder resist layer is a first solder resist layer, and the IC package substrate further includes a second solder resist layer, wherein the dielectric layer is disposed between the first and second solder resist layers.

Example 8 may include the subject matter of any of Examples 1-7, and may further specify that the dielectric layer is formed from a prepreg material.

Example 9 may include the subject matter of any of Examples 1-8, and may further specify that the IC package substrate has a rectangular footprint smaller than 5 millimeters by 5 millimeters.

Example 10 may include the subject matter of any of Examples 1-9, and may further specify that a thickness of the dielectric layer between the first face and the second face of the dielectric layer is between 50 and 200 µm.

Example 11 is an integrated circuit (IC) package structure, including: an IC package substrate, including a dielectric layer having a first face and a second face, and a metal layer disposed at the first face of the dielectric layer having a first face and a second face, wherein the second face of the metal layer is disposed between the first face of the metal layer and the second face of the dielectric layer; a die; die solder material disposed between the die and the metal layer to electrically couple the die to the metal layer; and package solder material disposed on the metal layer such that the package solder material is electrically coupled to the die via the metal layer.

Example 12 may include the subject matter of Example 11, and may further specify that the package solder material is a ball grid array (BGA) solder ball.

Example 13 may include the subject matter of Example 12, and may further specify that the BGA solder ball extends away from the metal layer with a height between 200 and 350 µm.

Example 14 may include the subject matter of any of Examples 12-13, and may further specify that the BGA solder ball is a first BGA solder ball, the IC package structure further includes a second BGA solder ball, and the first and second BGA solder balls are spaced apart with a pitch between 300 and 650 microns.

Example 15 may include the subject matter of any of Examples 11-14, and may further include an underfill material between the die and the IC package substrate.

Example 16 may include the subject matter of any of Examples 11-15, and may further include solder resist between the die and the dielectric layer.

Example 17 may include the subject matter of any of Examples 11-15, and may further specify that no solder resist is disposed between the die and the dielectric layer.

Example 18 may include the subject matter of any of Examples 11-17, and may further specify that a thickness of the metal layer between the first face of the metal layer and the second face of the metal layer is between 10 and 20 µm.

Example 19 may include the subject matter of any of Examples 11-18, and may further specify that the die includes a die metal layer and a via, and the metal layer of the die is electrically coupled to the metal layer of the IC package substrate by the via, a copper material electrically coupled to the via, and the die solder material.

Example 20 may include the subject matter of any of Examples 11-19, and may further include a component electrically coupled to the metal layer through the package solder material.

Example 21 may include the subject matter of Example 20, and may further specify that the component is a printed circuit board.

Example 22 may include the subject matter of any of Examples 11-21, and may further specify that the IC package substrate has a rectangular footprint smaller than 5 millimeters by 5 millimeters.

Example 23 is a method of manufacturing an integrated circuit (IC) package substrate, including: providing a patterned resist material on a copper foil disposed on a core; after providing the patterned resist material, electroplating copper on the patterned resist material; after electroplating copper, removing the patterned resist material to form patterned copper; laminating a prepreg material on the patterned copper to form a dielectric layer; after laminating the prepreg material, removing the core; and after removing the core, etching the copper foil and at least some of the patterned copper to form an IC package substrate having copper recessed in the dielectric layer.

Example 24 may include the subject matter of Example 23, and may further specify that the dielectric layer has a first face and an opposing second face, the copper recessed in the dielectric layer provides a metal layer having a first face and a second face, the metal layer is disposed at the first face of the dielectric layer, the second face of the metal layer is disposed between the first face of the metal layer and the second face of the dielectric layer, the metal layer provides a package contact at the first face of the metal layer to couple the IC package substrate to a component, and the metal layer provides a die contact at the first face of the metal layer to couple a die to the IC package.

Example 25 may include the subject matter of any of Examples 23, and may further specify that the copper is recessed in the dielectric layer at a first face of the dielectric layer, and the method further includes, after etching, providing solder resist to the first face or an opposing second face of the dielectric layer.

Example 26 is a method of manufacturing an integrated circuit (IC) package, including: coupling a die to a die contact of an IC package substrate, wherein the IC package substrate includes a dielectric layer having a first face and a second face, a metal layer disposed at the first face of the dielectric layer and having a first face and a second face, wherein the second face of the metal layer is disposed between the first face of the metal layer and the second face of the dielectric layer, a package contact at the first face of the metal layer to couple the IC package substrate to a component, and the die contact at the first face of the metal layer; and providing solder material to the package contact.

Example 27 may include the subject matter of Example 26, and may further include coupling the IC package substrate to a component with the solder material.

Example 28 may include the subject matter of any of Examples 26-27, and may further specify that coupling the die to the IC package substrate includes: providing the die having a solder bump; and coupling the die to the IC package with the solder bump at the die contact.

Example 29 may include the subject matter of any of Examples 26-27, and may further specify that coupling the die to the IC package substrate includes: providing a solder bump to the die contact; and coupling a conductive contact of the die to the solder bump.

Example 30 is a computing device, including: an integrated circuit (IC) package, including a die and an IC package substrate, wherein the IC package substrate includes a dielectric layer, a metal layer having a first face and a second face, wherein the second face is disposed between the first face and the dielectric layer, a package contact at the first face of the metal layer to couple the IC package to a printed circuit board, and a die contact at the first face of the metal layer to couple the die to the IC package; and the printed circuit board, wherein the IC package is coupled to the printed circuit board with solder material disposed between the printed circuit board and the package contact; wherein the die includes a memory device or a processing device.

Example 31 may include the subject matter of Example 30, and may further specify that the computing device is a tablet or a smart phone.

Example 32 may include the subject matter of any of Examples 30-31, and may further specify that the computing device further includes an input device and an output device.

Example 33 may include the subject matter of Example 32, and may further specify that the input device includes a touch screen and the output device includes a display.

Example 34 is a method for manufacturing any of the IC package substrates disclosed herein.

Example 35 is a method for manufacturing any of the IC package structures disclosed herein.

What is claimed is:

1. An integrated circuit (IC) package substrate, comprising:
    a dielectric layer having a first face and a second face;

a metal layer at the first face of the dielectric layer and having a first face and a second face,
wherein the second face of the metal layer is between the first face of the metal layer and the second face of the dielectric layer;
a package contact at the first face of the metal layer to couple the IC package substrate to a component; and
a die contact at the first face of the metal layer to couple a die to the IC package substrate;
wherein the package contact and the die contact are electrically coupled within the metal layer, the metal layer is recessed in the dielectric layer, and the package contact and the die contact are recessed in the dielectric layer.

2. The IC package substrate of claim 1, wherein no vias are in the dielectric layer.

3. The IC package substrate of claim 1, wherein the metal layer is the only metal layer in the IC package substrate.

4. The IC package substrate of claim 1, further comprising:
a solder resist layer at the first face of the dielectric layer and including an opening corresponding to the package contact.

5. The IC package substrate of claim 4, wherein the solder resist layer is a first solder resist layer, and the IC package substrate further comprises:
a second solder resist layer, wherein the dielectric layer is between the first and second solder resist layers.

6. The IC package substrate of claim 1, wherein the dielectric layer is formed from a prepreg material.

7. The IC package substrate of claim 1, wherein the IC package substrate has a rectangular footprint smaller than 5 millimeters by 5 millimeters.

8. The IC package substrate of claim 1, wherein a thickness of the dielectric layer between the first face and the second face of the dielectric layer is between 50 and 200 μm.

9. The IC package substrate of claim 1, wherein the metal layer includes a continuous metal segment, and the package contact and the die contact are electrically coupled to the continuous metal segment.

10. An integrated circuit (IC) package structure, comprising:
an IC package substrate, including:
a dielectric layer having a first face and a second face, wherein no vias are disposed in the dielectric layer and
a metal layer, at the first face of the dielectric layer, having a first face and a second face, wherein the second face of the metal layer is between the first face of the metal layer and the second face of the dielectric layer;
a die;
die solder material between the die and the metal layer to electrically couple the die to the metal layer; and
package solder material on the metal layer such that the package solder material is electrically coupled to the die via the metal layer;
wherein the IC package substrate has a rectangular footprint smaller than 5 millimeters by 5 millimeters.

11. The IC package structure of claim 10, wherein the package solder material is a ball grid array (BGA) solder ball.

12. The IC package structure of claim 11, wherein the BGA solder ball extends away from the metal layer with a height between 200 and 350 μm.

13. The IC package structure of claim 11, wherein the BGA solder ball is a first BGA solder ball, the IC package structure further includes a second BGA solder ball, and the first and second BGA solder balls are spaced apart with a pitch between 300 and 650 microns.

14. The IC package structure of claim 10, further comprising an underfill material between the die and the IC package substrate.

15. The IC package structure of claim 10, wherein the die includes a die metal layer and a via, and the metal layer of the die is electrically coupled to the metal layer of the IC package substrate by the via, a copper material electrically coupled to the via, and the die solder material.

16. The IC package structure of claim 10, further comprising:
a component electrically coupled to the metal layer through the package solder material.

17. The IC package structure of claim 16, wherein the component is a printed circuit board.

18. The IC package structure of claim 10, wherein the metal layer includes a continuous metal segment, and the package solder material and the die solder material are electrically coupled to the continuous metal segment.

19. An integrated circuit (IC) package substrate, comprising:
a dielectric layer having a first face and a second face, wherein no vias are disposed in the dielectric layer;
a metal layer disposed at the first face of the dielectric layer and having a first face and a second face, wherein the second face of the metal layer is disposed between the first face of the metal layer and the second face of the dielectric layer;
a package contact at the first face of the metal layer to couple the IC package substrate to a component; and
a die contact at the first face of the metal layer to couple a die to the IC package substrate.

20. The IC package substrate of claim 19, wherein the IC package substrate has a rectangular footprint smaller than 5 millimeters by 5 millimeters.

21. An integrated circuit (IC) package substrate, comprising:
a dielectric layer having a first face and a second face;
a metal layer disposed at the first face of the dielectric layer and having a first face and a second face, wherein the second face of the metal layer is disposed between the first face of the metal layer and the second face of the dielectric layer, and wherein the metal layer is the only metal layer in the IC package substrate;
a package contact at the first face of the metal layer to couple the IC package substrate to a component; and
a die contact at the first face of the metal layer to couple a die to the IC package substrate.

22. The IC package substrate of claim 21, wherein the IC package substrate has a rectangular footprint smaller than 5 millimeters by 5 millimeters.

* * * * *